US010873116B2

(12) United States Patent
Chen

(10) Patent No.: US 10,873,116 B2
(45) Date of Patent: Dec. 22, 2020

(54) CHARGING DEVICE HAVING THERMOELECTRIC MODULE

(71) Applicant: Lee Fei Chen, New Taipei (TW)

(72) Inventor: Lee Fei Chen, New Taipei (TW)

(*) Notice: Subject to any disclaimer, the term of this patent is extended or adjusted under 35 U.S.C. 154(b) by 217 days.

(21) Appl. No.: 15/983,978

(22) Filed: May 18, 2018

(65) Prior Publication Data

US 2019/0356029 A1 Nov. 21, 2019

(51) Int. Cl.
*H02J 7/00* (2006.01)
*H01M 10/6572* (2014.01)
*H01L 35/32* (2006.01)
*H01M 10/6563* (2014.01)
*H01M 10/44* (2006.01)
*H01M 10/613* (2014.01)

(52) U.S. Cl.
CPC ........ *H01M 10/6572* (2015.04); *H01L 35/32* (2013.01); *H01M 10/441* (2013.01); *H01M 10/613* (2015.04); *H01M 10/6563* (2015.04); *H02J 7/0013* (2013.01); *H02J 7/0042* (2013.01)

(58) Field of Classification Search
CPC .......... H01M 10/6572; H01M 10/613; H01M 10/441; H01M 10/6563; H02J 7/0013; H02J 7/0042; H01L 35/32
USPC ....................................................... 320/112
See application file for complete search history.

(56) References Cited

U.S. PATENT DOCUMENTS

| | | | | |
|---|---|---|---|---|
| 3,635,037 A * | 1/1972 | Hubert | ................... | H01L 35/30 62/3.2 |
| 4,089,184 A * | 5/1978 | Beitner | ................... | F25B 21/02 62/3.62 |
| 4,229,687 A * | 10/1980 | Newman | ............... | H01M 10/44 320/112 |
| 4,314,008 A * | 2/1982 | Blake | .................. | H01M 10/486 429/120 |
| 5,229,702 A * | 7/1993 | Boehling | ................ | F25B 21/04 307/66 |
| 5,705,770 A * | 1/1998 | Ogasawara | ............... | H02J 7/34 136/205 |
| 5,871,859 A * | 2/1999 | Parise | .................... | B29C 48/92 320/150 |
| 6,057,050 A * | 5/2000 | Parise | .................... | H02J 50/00 429/7 |
| 6,294,721 B1 * | 9/2001 | Oravetz | .................. | H01L 35/02 136/203 |
| 6,345,507 B1 * | 2/2002 | Gillen | .................... | F25B 21/04 136/203 |
| 6,455,186 B1 * | 9/2002 | Moores, Jr. | ............. | B25F 5/008 320/113 |

(Continued)

*Primary Examiner* — John T Trischler
(74) *Attorney, Agent, or Firm* — Hershkovitz & Associates, PLLC; Abe Hershkovitz

(57) ABSTRACT

Provided is a charging device having a thermoelectric device, including at least one battery unit. The at least one battery unit includes a battery and a thermoelectric module, wherein the battery is mounted on a first surface of the thermoelectric module and the battery contacts the first surface. When the thermoelectric module is provided with a supplying voltage through two voltage input terminals, a temperature difference is generated between a second surface of the thermoelectric module and the first surface, so that the thermoelectric module either heats up or cools down the battery depending on different battery temperatures and conditions, thus ensuring the charging efficiency and safety.

5 Claims, 5 Drawing Sheets

(56) References Cited

U.S. PATENT DOCUMENTS

| | | | | |
|---|---|---|---|---|
| 6,580,025 B2* | 6/2003 | Guy | F24F 5/0042 | 136/201 |
| 6,645,666 B1* | 11/2003 | Moores, Jr. | B25F 5/008 | 29/623.1 |
| 6,651,446 B1* | 11/2003 | Woods | F25B 21/02 | 136/242 |
| 6,891,353 B2* | 5/2005 | Tsukamoto | H01M 10/44 | 320/136 |
| 6,949,309 B2* | 9/2005 | Moores, Jr. | B25F 5/008 | 320/113 |
| 6,955,055 B2* | 10/2005 | Ebermann | H01M 2/1077 | 312/236 |
| 7,014,945 B2* | 3/2006 | Moores, Jr. | B25F 5/008 | 429/120 |
| 7,056,616 B2* | 6/2006 | Moores, Jr. | B25F 5/008 | 429/120 |
| 7,061,208 B2* | 6/2006 | Nishihata | G05D 23/1919 | 320/150 |
| 7,230,404 B2* | 6/2007 | Kimoto | H01M 2/1077 | 320/150 |
| 7,252,904 B2* | 8/2007 | Moores, Jr. | B25F 5/008 | 429/120 |
| 7,270,910 B2* | 9/2007 | Yahnker | H01M 10/659 | 429/62 |
| 7,326,490 B2* | 2/2008 | Moores, Jr. | B25F 5/008 | 429/120 |
| 7,384,704 B2* | 6/2008 | Scott | B60H 1/00278 | 136/204 |
| 7,649,139 B2* | 1/2010 | Mihara | C23C 14/08 | 136/236.1 |
| 7,736,792 B2* | 6/2010 | Moores, Jr. | H01M 10/653 | 429/71 |
| 7,777,445 B2* | 8/2010 | Uchiyama | H02J 7/0042 | 320/101 |
| 7,939,193 B2* | 5/2011 | Moores, Jr. | B25F 5/008 | 429/120 |
| 7,968,223 B2* | 6/2011 | Lee | H01M 2/1077 | 429/120 |
| 8,080,326 B2* | 12/2011 | Chan | H01M 8/0267 | 429/62 |
| 8,330,416 B2* | 12/2012 | Goma | H01M 10/46 | 320/107 |
| 8,658,299 B2* | 2/2014 | Yang | H01M 10/0525 | 429/62 |
| 8,692,506 B2* | 4/2014 | Saito | H01M 10/6571 | 320/103 |
| 8,734,977 B2* | 5/2014 | Lee | H01M 10/615 | 429/120 |
| 8,830,676 B2* | 9/2014 | Borck | H01M 2/1061 | 165/104.33 |
| 8,841,015 B2* | 9/2014 | Yoon | B60L 1/003 | 429/120 |
| 8,924,056 B2* | 12/2014 | Chorian | B60K 6/445 | 701/22 |
| 8,974,942 B2* | 3/2015 | Bell | H01M 10/6568 | 429/120 |
| 9,114,181 B2* | 8/2015 | Stoddard | H02J 7/0013 | |
| 9,265,847 B2* | 2/2016 | Stoddard | A61L 2/07 | |
| 9,312,580 B2* | 4/2016 | Nguyen | H01M 10/625 | |
| 9,564,571 B2* | 2/2017 | Cheng | H01L 35/32 | |
| 9,590,282 B2* | 3/2017 | Kossakovski | H01M 10/6551 | |
| 9,620,827 B2* | 4/2017 | Houchin-Miller | B60L 3/0076 | |
| 9,627,725 B2* | 4/2017 | Merriman | H01M 10/613 | |
| 9,666,914 B2* | 5/2017 | Bell | H01M 10/625 | |
| 10,236,547 B2* | 3/2019 | Kossakovski | H01M 10/6554 | |
| 10,270,141 B2* | 4/2019 | Piggott | H01M 10/6572 | |
| 10,361,577 B2* | 7/2019 | Gleason | H01M 10/486 | |
| 2002/0034682 A1* | 3/2002 | Moores, Jr. | B25F 5/008 | 429/120 |
| 2002/0197527 A1* | 12/2002 | Moores, Jr. | B25F 5/008 | 429/120 |
| 2003/0027037 A1* | 2/2003 | Moores, Jr. | B25F 5/008 | 429/82 |
| 2003/0064283 A1* | 4/2003 | Uemoto | H01M 2/08 | 429/149 |
| 2004/0086780 A1* | 5/2004 | Ebermann | H01M 2/1077 | 429/120 |
| 2004/0135550 A1* | 7/2004 | Nishihata | G05D 23/1919 | 320/150 |
| 2004/0174138 A1* | 9/2004 | Moores, Jr. | H01M 10/617 | 320/114 |
| 2004/0175610 A1* | 9/2004 | Moores, Jr. | H01M 2/1066 | 429/120 |
| 2005/0133206 A1* | 6/2005 | Scott | B60H 1/00278 | 165/122 |
| 2005/0202310 A1* | 9/2005 | Yahnker | B25F 5/008 | 429/62 |
| 2006/0110656 A1* | 5/2006 | Moores, Jr. | B25F 5/008 | 429/83 |
| 2006/0216582 A1* | 9/2006 | Lee | H01M 10/613 | 429/120 |
| 2006/0216583 A1* | 9/2006 | Lee | H01M 10/615 | 429/120 |
| 2007/0128505 A9* | 6/2007 | Yahnker | H01M 10/633 | 429/62 |
| 2007/0144573 A1* | 6/2007 | Mihara | H01L 35/32 | 136/205 |
| 2008/0003491 A1* | 1/2008 | Yahnker | H01M 2/1055 | 429/62 |
| 2008/0087315 A1* | 4/2008 | Deming | F24F 5/0042 | 136/203 |
| 2008/0102355 A1* | 5/2008 | Moores, Jr. | H01M 10/6554 | 429/96 |
| 2008/0268333 A1* | 10/2008 | Barrella | H01M 2/1016 | 429/120 |
| 2009/0284230 A1* | 11/2009 | Goma | H01M 10/46 | 320/152 |
| 2011/0003188 A1* | 1/2011 | Cheng | H01M 10/613 | 429/120 |
| 2011/0017252 A1* | 1/2011 | Braun | H01L 35/32 | 136/204 |
| 2011/0082607 A1* | 4/2011 | Chorian | B60K 6/445 | 701/22 |
| 2011/0236731 A1* | 9/2011 | Bell | H01M 10/637 | 429/50 |
| 2011/0287285 A1* | 11/2011 | Yoon | B60L 1/003 | 429/9 |
| 2011/0300420 A1* | 12/2011 | Johnson, Jr. | H01M 10/6563 | 429/62 |
| 2012/0068668 A1* | 3/2012 | Kittell | B60L 11/185 | 320/162 |
| 2012/0249060 A1* | 10/2012 | Stoddard | G05D 23/1904 | 320/107 |
| 2012/0282497 A1* | 11/2012 | Yang | H01M 10/0525 | 429/50 |
| 2012/0285758 A1* | 11/2012 | Bell | H01M 10/486 | 180/68.4 |
| 2013/0008181 A1* | 1/2013 | Makansi | F25B 21/04 | 62/3.3 |
| 2013/0152560 A1* | 6/2013 | Hwang | H01L 35/30 | 60/320 |
| 2013/0207617 A1* | 8/2013 | Houchin-Miller | B60L 3/0076 | 320/150 |
| 2014/0009857 A1* | 1/2014 | Suzuki | H02B 3/08 | 361/87 |
| 2014/0072844 A1* | 3/2014 | Oh | H01M 10/6563 | 429/71 |
| 2014/0072845 A1* | 3/2014 | Oh | H01M 10/6563 | 429/71 |
| 2014/0165597 A1* | 6/2014 | Hernon | H01M 10/6572 | 62/3.2 |
| 2014/0311543 A1* | 10/2014 | Jinushi | H01L 35/30 | 136/205 |
| 2015/0000327 A1* | 1/2015 | Kakehashi | F25D 17/02 | 62/434 |
| 2015/0037649 A1* | 2/2015 | Wyatt | H01M 10/625 | 429/120 |

(56) References Cited

U.S. PATENT DOCUMENTS

| | | | |
|---|---|---|---|
| 2015/0037662 A1* | 2/2015 | Pinon | H01M 2/0237 |
| | | | 429/179 |
| 2015/0101353 A1* | 4/2015 | Oh | B60H 1/00478 |
| | | | 62/3.2 |
| 2015/0101354 A1* | 4/2015 | Oh | H01M 10/6572 |
| | | | 62/3.2 |
| 2015/0101355 A1* | 4/2015 | Oh | F25B 21/04 |
| | | | 62/3.3 |
| 2015/0175029 A1* | 6/2015 | Oh | F25B 21/02 |
| | | | 62/3.6 |
| 2015/0229011 A1* | 8/2015 | Gless | H01M 10/625 |
| | | | 62/3.2 |
| 2015/0244042 A1* | 8/2015 | Bell | H01M 10/61 |
| | | | 429/9 |
| 2015/0333246 A1* | 11/2015 | Lee | H01L 35/32 |
| | | | 136/205 |
| 2015/0335772 A1* | 11/2015 | Stoddard | H02J 7/0013 |
| | | | 320/112 |
| 2015/0357692 A1* | 12/2015 | Piggott | H01M 10/6572 |
| | | | 320/107 |
| 2016/0149107 A1* | 5/2016 | Cheng | H01L 35/32 |
| | | | 136/205 |
| 2016/0240903 A1* | 8/2016 | Kossakovski | H01M 10/6572 |
| 2017/0214099 A1* | 7/2017 | Fleming | H01M 10/613 |
| 2017/0271728 A1* | 9/2017 | Kossakovski | H01M 10/6551 |
| 2017/0294692 A1* | 10/2017 | Bell | H01M 10/6556 |
| 2017/0338535 A1* | 11/2017 | Bhoir | H01M 10/6554 |
| 2017/0358831 A1* | 12/2017 | Milroy | H01M 10/658 |
| 2019/0252745 A1* | 8/2019 | Piggott | H01M 10/655 |

* cited by examiner

CHARGING DEVICE HAVING THERMOELECTRIC MODULE

BACKGROUND OF THE INVENTION

1. Field of the Invention

The present invention relates to a charging device, and more particularly to a charging device having a thermoelectric module.

2. Description of the Related Art

While eco-friendly and energy-saving technology is amongst the top trend developments in recent years, rechargeable batteries are widely used in both industries and daily life, such as rechargeable dry-cell-sized battery, rechargeable appliance, and electric automobiles. In order to meet the needs of the users and enhance the convenience of such products, the charging efficiency must be improved as well as the safety during battery charging. To be more exact, whatever the material is used to build a battery, the battery needs to be operated in a proper working temperature range. The charging or the discharging process may be at a poor condition when the battery temperature is out of the proper temperature range.

For instance, release of thermal energy during the charging process of a battery is inevitable. As the input current raises to speed up the charging efficiency of the battery, the release of thermal energy also increases with a positive ratio, causing the temperature of the battery to rise rapidly. If the heat is not dissipated properly, the temperature of the battery may be dangerously high and causes explosion of the battery eventually. A conventional cooling system consists mostly of a fan device to drive the air around the battery to flow and bring away the thermal energy by conduction and convection of heat. However, the thermal conductivity of air limits the cooling efficiency of such system. On the other hand, if the battery is placed in an environment where the temperature is far below the proper working temperature range, the electrolyte of the battery may be solidified, thereby leading to a significant drop of the charging efficiency.

In conclusion, in order to achieve both high efficiency and safety during battery charging, the battery charging device needs to be improved.

SUMMARY OF THE INVENTION

An objective of the present invention is to provide a charging device having a thermoelectric module.

To achieve the foregoing objective, the charging device includes at least one battery unit, and the at least one battery unit each includes a battery and a thermoelectric module. The battery has a positive electrode and a negative electrode so as to receive a charging voltage while charging. The thermoelectric module has a first surface, a second surface, and two voltage input terminals, wherein the battery is mounted on the first surface of the thermoelectric module so that the first surface is directly in contact with the battery. Moreover, when the thermoelectric module receives a supplying voltage through the two voltage input terminals, the thermoelectric module maintains a temperature difference between the first surface and the second surface.

The thermoelectric module can be a thermoelectric cooler, and particularly the thermoelectric module can be a semiconductor thermoelectric cooling module, which enables direct conversion between thermal and electrical energies. The thermoelectric cooler consists of two different thermoelectric materials. In accordance with the theory of the thermoelectric effect, when a voltage difference is provided between the two thermoelectric materials, temperature difference will be generated between the two thermoelectric materials; as the voltage difference provided between the two thermoelectric materials is reversed, the temperature difference between the two thermoelectric materials will be opposite. That is to say, by providing opposite supplying voltage to the two voltage input terminals of the thermoelectric module, the thermoelectric module makes the temperature of the first surface either higher or lower than that of the second surface. Depending on the battery temperature condition, one can either heat up or cool down the battery so as to ensure the charging efficiency and safety in different environmental conditions.

Other objectives, advantages and novel features of the invention will become more apparent from the following detailed description when taken in conjunction with the accompanying drawings.

DETAILED DESCRIPTION OF THE INVENTION

Figure 1:
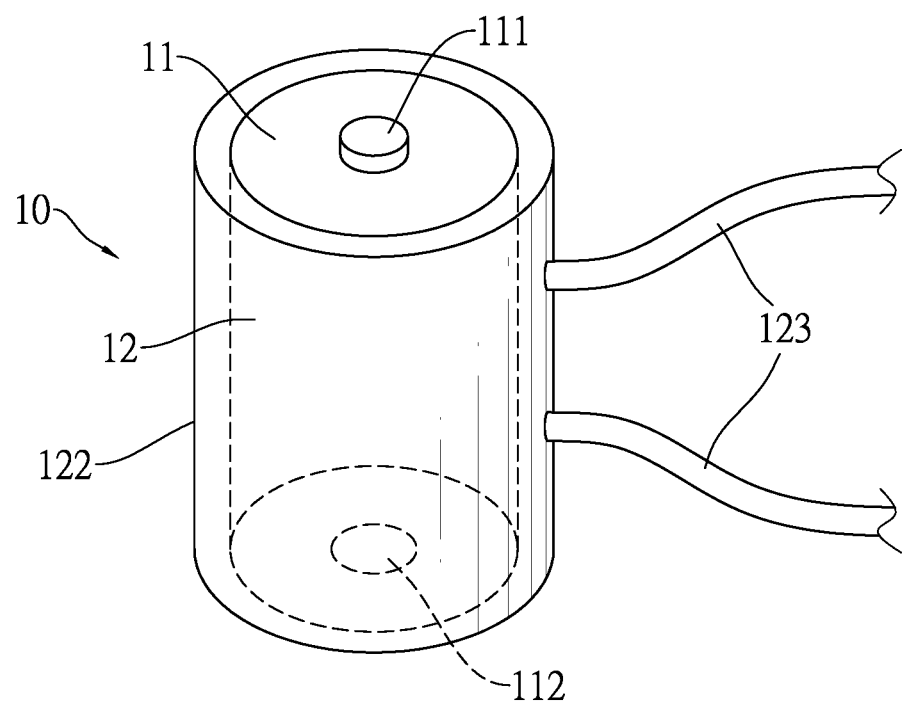
FIG. 1 is a schematic view of a charging device having a thermoelectric module of the present invention.
Figure 2:
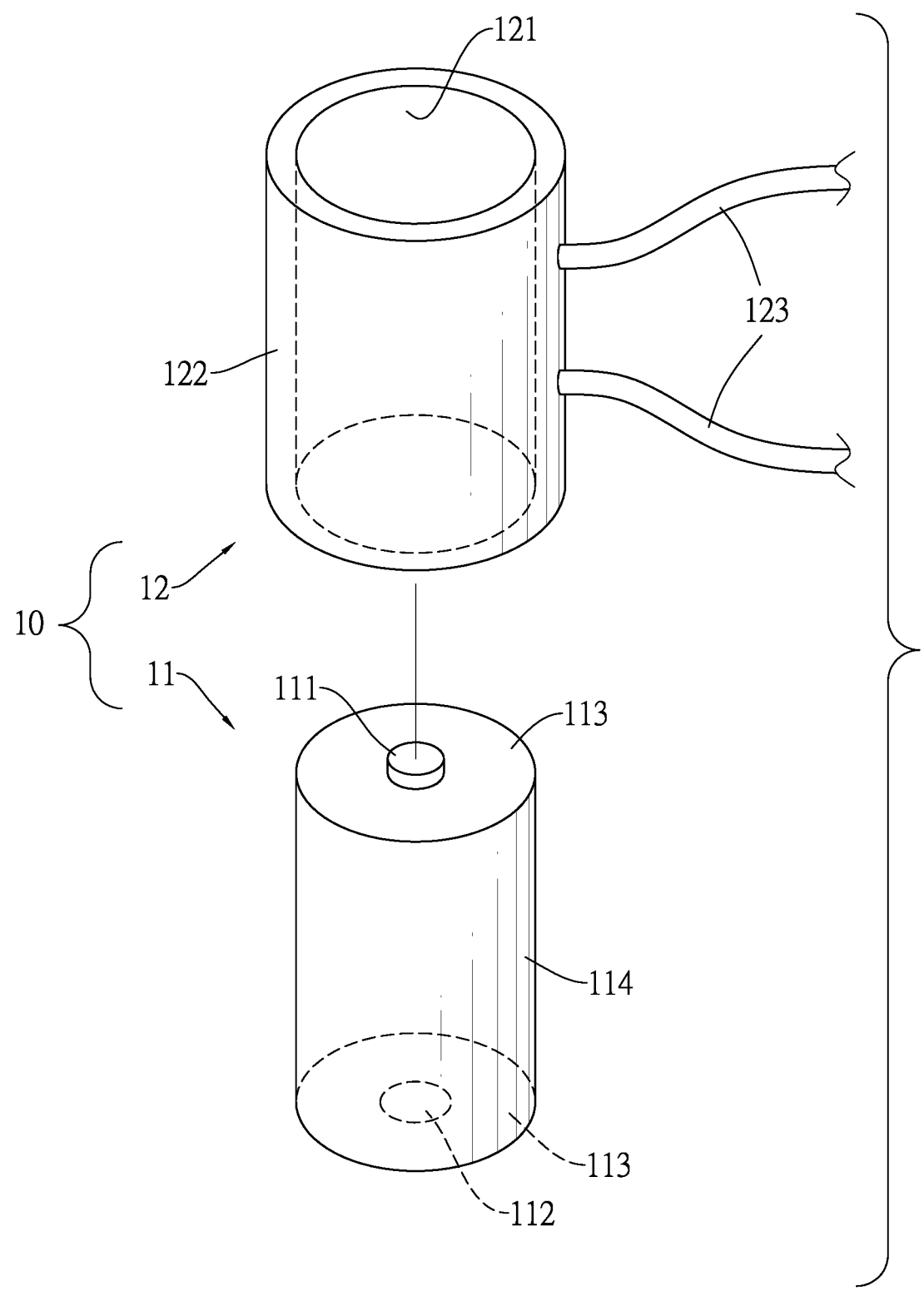
FIG. 2 is an exploded view of a charging device having a thermoelectric module of the present invention.

With reference to FIG. 1 and FIG. 2, the present invention is a charging device having a thermoelectric module, including at least one battery unit 10, and each of the at least one battery unit 10 includes a battery 11 and a thermoelectric module 12. The battery 11 has a positive electrode 111 and a negative electrode 112, and a charging voltage is provided to the positive electrode 111 and the negative electrode 112. The thermoelectric module 12 has a first surface 121, a second surface 122, and two voltage input terminals 123, wherein the battery 11 is mounted on the first surface 121 of the thermoelectric module 12 and the first surface 121 contacts the battery 11. Moreover, when a supplying voltage is provided to the two voltage input terminals 123, a temperature difference is generated between the first surface 121 and the second surface 122 of the thermoelectric module 12.

The thermoelectric module 12 can be a thermoelectric cooler, and particularly a semiconductor thermoelectric cooling module, which enables direct conversion between thermal and electrical energies. The thermoelectric cooler is made of two different thermoelectric materials. In accordance with the theory of the thermoelectric effect, when a voltage difference is provided between the two thermoelectric materials, a temperature difference will then be generated; as the voltage polarities of the two thermoelectric materials are opposite, the temperature differences will be opposite. That is to say, by providing opposite supplying voltage to the thermoelectric module 12 through the two voltage input terminals 123, the thermoelectric module 12 makes the temperature of the first surface 121 either higher or lower than that of the second surface 122. As a result, depending on the temperature condition of the battery 11, a user can either heat up or cool down the battery 11 by operating the thermoelectric module 12 so as to ensure the charging efficiency and safety in different environmental conditions.

A thermal paste layer applied between the first surface 121 of the thermoelectric module 12 and the battery 11 will further improve the thermal conducting efficiency.

In a first embodiment of the present invention, the supplying voltage is a first voltage, and the thermoelectric module 12 makes the temperature of the first surface 121 lower than the temperature of the second surface 122. Since the surface of the battery 11 directly contacts the first surface 121 of the thermoelectric module 12, and the temperature of the first surface 121 is kept lower than that of the second surface 122, the thermoelectric module 12 can absorb the heat of the battery 11 by the first surface 121, and can release the thermal energy to the air. Therefore, the thermoelectric module 12 of the charging device improves the cooling efficiency, and thus allows the battery 11 to be charged with a larger current without being overheated, thereby improving the charging efficiency and ensuring safety in utilization.

In a second embodiment of the present invention, the supplying voltage is a second voltage, and a polarity of the second voltage is opposite to a polarity of the first voltage. Hence, according to the theory of the thermoelectric effect, the thermoelectric module 12 makes the temperature of the first surface 121 higher than the temperature of the second surface 122. When the battery 11 is placed in an environment much cooler than the proper working temperature, the second voltage can be provided to the thermoelectric module 12, and the thermoelectric module 12 maintains the temperature of the first surface 121 higher than that of the second surface 122. Since the battery 11 directly contacts the first surface 121 of the thermoelectric module 12, the thermoelectric module 12 keeps the temperature of the battery 11 higher than the environment temperature to prevent the battery 11 from poor charging efficiency and power capacity caused by low temperature.

With reference to FIG. 2, in a third embodiment of the present invention, the shape of the thermoelectric module 12 matches the shape of a surface of the battery 11, so that the contact area of the thermoelectric module 12 and the battery 11 is large enough to increase effect of thermal conduction. For instance, the battery 11 is columnar, and the battery 11 has two undersides 113 and an annular surface 114. The two undersides 113 are mounted on two opposite ends of the annular surface 114. The positive electrode 111 is formed on one of the two undersides 113, and the negative electrode 112 is formed on the other underside 113. The thermoelectric module 12 is shaped into a hollow column, wherein the first surface 121 faces the hollow part and the second surface 122 faces outwards. The battery 11 is mounted into the hollow part of the thermoelectric module 12, and the first surface 121 contacts the annular surface 114 of the battery 11. As a result, the thermal energy is conducted effectively with a large contact area between the annular surface 114 of the battery 11 and the first surface 121 of the thermoelectric module 12 when there is a temperature difference between the first surface 121 and the second surface, thus providing a cooling effect or a heating effect to the body of the battery 11 evenly.

Figure 3:
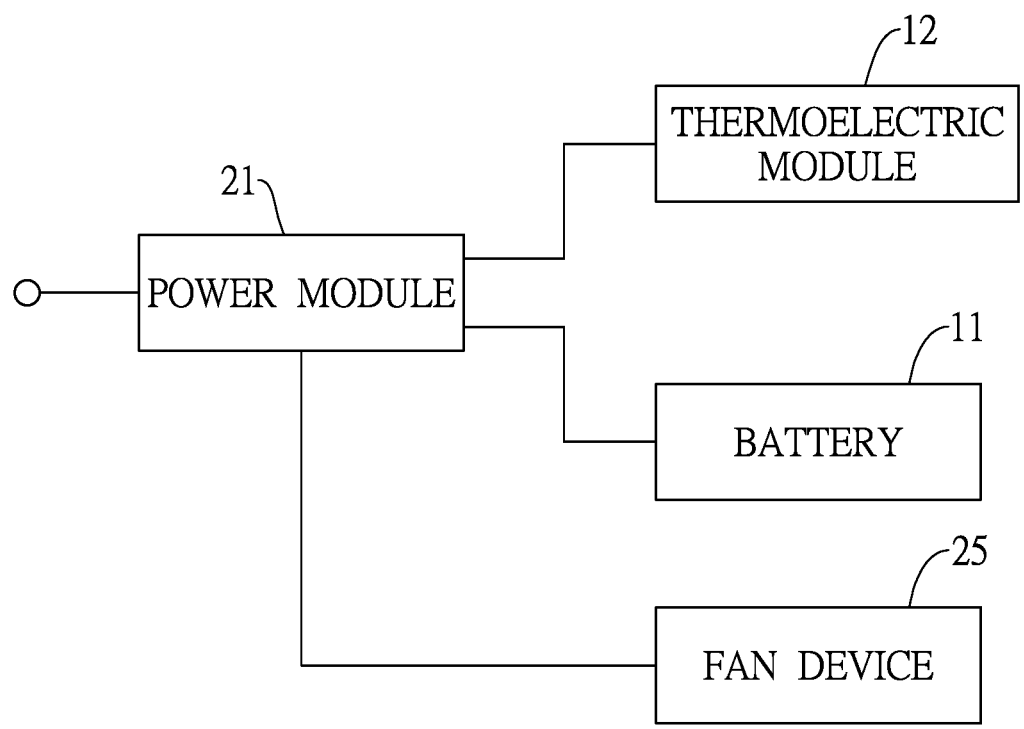
FIG. 3 is a block diagram of a fourth embodiment of a charging device having a thermoelectric module of the present invention.

With reference to FIG. 3, in a fourth embodiment of the present invention, the charging device further includes a power module 21. The power module 21 is provided with an external voltage from an external power source, and the power module 21 converts the external voltage into the charging voltage and the supplying voltage. The positive electrode 111 and the negative electrode 112 of the battery 11 are electrically connected to the power module 21 to receive the charging voltage, and the two voltage input terminals 123 of the thermoelectric module 12 are electrically connected to the power module 21 to receive the supplying voltage.

Figure 4:
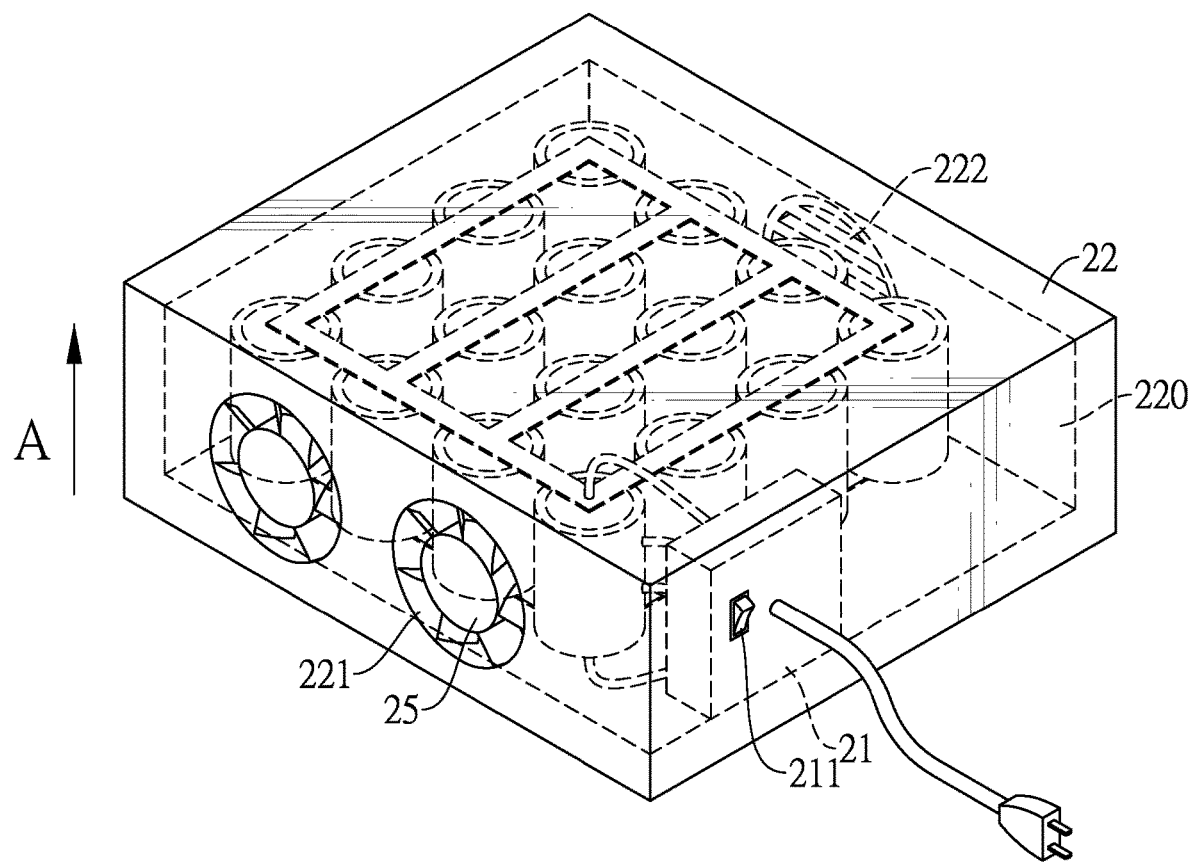
FIG. 4 is a perspective view of a fifth embodiment of a charging device having a thermoelectric module of the present invention.
Figure 5:
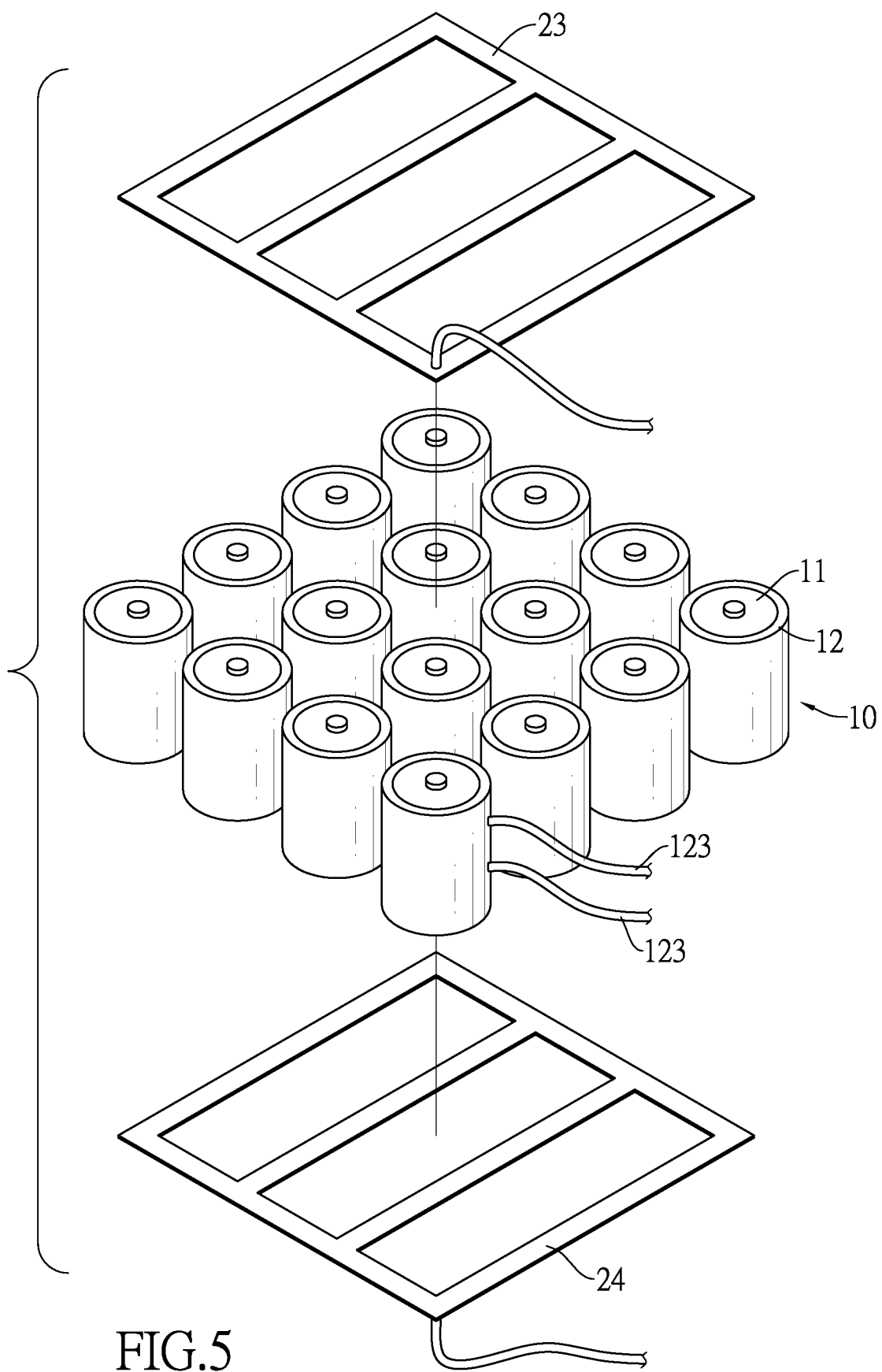
FIG. 5 is an exploded view of parts of a fifth embodiment of a charging device having a thermoelectric module of the present invention.

With reference to FIG. 4 and FIG. 5, the at least one battery unit 10 includes multiple battery units 10, and the battery units 10 are arranged in a rectangular matrix, wherein the positive electrodes 111 of the batteries 11 are faced to a first direction A.

With reference to FIG. 4, in a fifth embodiment of the present invention, the charging device further includes an outer shell 22 which has an inner space 220. The battery units 10 and the power module 21 are mounted in the inner space 220.

With further reference to FIG. 4 and FIG. 5, the charging device further includes a positive conducting element 23 and a negative conducting element 24. The positive conducting element 23 is electrically connected to the positive electrodes 111 of the batteries 11, and the negative conducting element 24 is electrically connected to the negative electrodes 112 of the batteries 11. The batteries 11 of the battery units 10 receive the charging voltage through the positive conducting element 23 and the negative conducting element 24 from the power module 21.

By integrating the battery units 10, the capacity of the charging device is enlarged. The thermoelectric module 12 of each battery unit 10 heats up or cools down the battery 11 and ensures the charging efficiency and safety of each battery 11, thus improving the charging efficiency and safety of the whole charging device.

With further reference to FIG. 3 and FIG. 4, the charging device in this embodiment further includes a fan device 25. The power module 21 further converts the external voltage into a driving voltage, and the outer shell 22 has a fan opening 221 and a vent opening 222. The fan opening 221 and the vent opening 222 communicate with the inner space 220. The fan device 25 is mounted in the fan opening 221 and electrically connected to the power module 21 to receive the driving voltage.

In a sixth embodiment of the present invention, the power module 21 further includes a switch 211. When the switch 211 is operated in a first state, which is, when the switch 211 is switched to a first position, the supplying voltage converted by the power module 21 is the first voltage, so the temperature of the first surface 121 of each thermoelectric module 12 is lower than that of the second surface 122. When the switch 211 is operated in a second state, which is, when the switch 211 is switched to a second position, the supplying voltage converted by the power module 21 is the second voltage, so the temperature of the first surface 121 of each thermoelectric module 12 is higher than that of the second surface 122.

Therefore, a user can decide whether to heat up or cool down the battery 11 depending on the environment temperature and battery condition by operating the switch 211. For example, when the charging device is in a warm environment and the batteries may overheat during a high power charging process, the user switches the switch 211 to the first position and the supplying voltage converted by the power module 21 is the first voltage. Therefore, the first surface 121 of the thermoelectric module 12 can be cooler than the second surface 122 of the thermoelectric module 12 to cool down the battery 11. The thermoelectric module 12 can absorb the thermal energy from the battery 11, and can release the thermal energy into the air.

Furthermore, the fan device 25 receives the driving voltage from the power module 21, and the fan device 25 can normally operate. The air inside the inner space 220 of the outer shell 22 can be driven to flow out of the inner space 220. Therefore, the air inside the inner space 220 can be exchanged with the air outside of the inner space 220 through the fan opening 221 and the vent opening 222. Thus, the thermal energy accumulating around the battery units 10 can be brought away along with the warm air inside the inner space 220 to further improve the cooling efficiency of each battery unit 10.

On the other hand, when the charging device is placed in an underheated environment, the user switches the switch 211 to the second position and the power module 21 provides the second voltage as the supplying voltage. Therefore, the temperature of the first surface 121 higher than the temperature of the second surface 122, and the thermoelectric modules 12 can heat up the battery 11. As a result, the charging efficiency and the power capacity of each battery 11 are improved.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A charging device comprising:
   multiple battery units; each battery unit comprising:
      a battery with a battery shape, comprising a positive electrode and a negative electrode, wherein a charging voltage is provided to the positive electrode and the negative electrode;
      a thermoelectric module with a module shape, comprising a first surface, a second surface, and two voltage input terminals; wherein the battery is mounted on the first surface of the thermoelectric module, and the module shape of the thermoelectric module matches the battery shape of a surface of the battery, such that the first surface of the thermoelectric module contacts the surface of the battery; wherein a temperature difference is generated between the first surface and the second surface when a supplying voltage is provided to the two voltage input terminals;
   a power module; wherein the power module receives an external voltage from an external power source, and the power module converts the external voltage to the charging voltage, the supplying voltage, and a driving voltage; wherein the positive electrode and the negative electrode of the battery are electrically connected to the power module to receive the charging voltage, and the two voltage input terminals of the thermoelectric module are electrically connected to the power module to receive the supplying voltage;
   an outer shell, having an inner space, a fan opening, and a vent opening; the fan opening and the vent opening communicate with the inner space, and the battery units and the power module are mounted in the inner space;
   a fan device, mounted in the fan opening and electrically connected to the power module to receive the driving voltage; wherein
   the battery units are arranged in a rectangular matrix with a space gap between each other; wherein the positive electrode of the battery of each battery unit is faced to a first direction; wherein the charging device further comprises:
      a positive conducting element, electrically connected to the positive electrode of the battery of each battery unit;
      a negative conducting element, electrically connected to the negative electrode of the battery of each battery unit; wherein the positive conducting element and the negative conducting element are electrically connected to the power module to receive the charging voltage.

2. The charging device as claimed in claim 1, wherein for each of the batteries of the multiple battery units the battery shape of the battery is columnar, the surface of the battery is an annular surface, and the battery also comprises two undersides; wherein the two undersides are set on two opposite ends of the surface; wherein the positive electrode is formed on one of the two undersides and the negative electrode is formed on the other one of the two undersides.

3. The charging device as claimed in claim 1, wherein the temperature of the first surface is lower than the temperature of the second surface when the supplying voltage is a first voltage.

4. The charging device as claimed in claim 3, wherein the temperature of the first surface is higher than the temperature of the second surface when the supplying voltage is a second voltage;
   wherein a polarity of the second voltage is opposite to a polarity of the first voltage.

5. The charging device as claimed in claim 4, wherein the power module further comprises:
   a switch;
   wherein the supplying voltage converted by the power module is the first voltage when the switch is operated in a first state;
   wherein the supplying voltage converted by the power module is the second voltage when the switch is operated in a second state.

* * * * *